(12) United States Patent
Morino et al.

(10) Patent No.: US 10,008,433 B2
(45) Date of Patent: Jun. 26, 2018

(54) SEMICONDUCTOR DEVICE

(71) Applicant: DENSO CORPORATION, Kariya, Aichi-pref. (JP)

(72) Inventors: Tomoo Morino, Kariya (JP); Hiroshi Ishino, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/308,627

(22) PCT Filed: May 21, 2015

(86) PCT No.: PCT/JP2015/002569
§ 371 (c)(1),
(2) Date: Nov. 3, 2016

(87) PCT Pub. No.: WO2015/186305
PCT Pub. Date: Dec. 10, 2015

(65) Prior Publication Data
US 2017/0162464 A1    Jun. 8, 2017

(30) Foreign Application Priority Data
Jun. 2, 2014 (JP) .................................. 2014-114204

(51) Int. Cl.
*H01L 29/15* (2006.01)
*H01L 31/0312* (2006.01)
(Continued)

(52) U.S. Cl.
CPC ...... *H01L 23/3675* (2013.01); *H01L 23/3107* (2013.01); *H01L 23/3736* (2013.01); *H01L 24/33* (2013.01); *H01L 29/045* (2013.01); *H01L 29/1608* (2013.01); *H01L 2224/32245* (2013.01); *H01L 2224/33181* (2013.01); *H01L 2924/01013* (2013.01); *H01L 2924/01029* (2013.01);
(Continued)

(58) Field of Classification Search
USPC ........................................ 257/77; 438/460
See application file for complete search history.

(56) References Cited

U.S. PATENT DOCUMENTS

| | | | |
|---|---|---|---|
| 2003/0022464 A1* | 1/2003 | Hirano | H01L 21/565 438/460 |
| 2008/0224282 A1 | 9/2008 | Ashida et al. | |

(Continued)

*Primary Examiner* — Tram H Nguyen
(74) *Attorney, Agent, or Firm* — Posz Law Group, PLC

(57) ABSTRACT

A semiconductor device includes a semiconductor chip formed using a silicon carbide and having electrodes on a first surface and a second surface opposite to the first surface, a terminal disposed adjacent to the first surface and connected to the electrode on the first surface through a bonding member, and a heat sink disposed adjacent to the second surface and connected to the electrode on the second surface through a bonding member. The first surface is a (0001) plane and a thickness direction of the semiconductor chip corresponds to a [0001] direction. Of the distances between the end portions of the semiconductor chip having a square two-dimensional shape and the end portions of the terminal having a rectangular two-dimensional shape, the shortest distance L1 in a [1-100] direction is shorter than the shortest distance L2 in a [11-20] direction.

5 Claims, 7 Drawing Sheets

(51) Int. Cl.
*H01L 23/367* (2006.01)
*H01L 29/16* (2006.01)
*H01L 29/04* (2006.01)
*H01L 23/31* (2006.01)
*H01L 23/00* (2006.01)
*H01L 23/373* (2006.01)

(52) U.S. Cl.
CPC .............. *H01L 2924/01042* (2013.01); *H01L 2924/0665* (2013.01); *H01L 2924/10162* (2013.01); *H01L 2924/10272* (2013.01); *H01L 2924/1203* (2013.01); *H01L 2924/13091* (2013.01); *H01L 2924/1425* (2013.01); *H01L 2924/186* (2013.01); *H01L 2924/351* (2013.01)

(56) References Cited

U.S. PATENT DOCUMENTS

| | | | |
|---|---|---|---|
| 2010/0238627 A1* | 9/2010 | Shinohara | H01L 23/3107 361/695 |
| 2012/0261676 A1* | 10/2012 | Nakano | H01L 29/165 257/77 |
| 2013/0112993 A1* | 5/2013 | Hayashi | H01L 23/049 257/77 |
| 2016/0071998 A1* | 3/2016 | Nakano | H01L 29/7827 257/77 |

* cited by examiner

SEMICONDUCTOR DEVICE

CROSS REFERENCE TO RELATED APPLICATIONS

This application is a U.S. national stage application of International Patent Application No. PCT/JP2015/002569 filed on May 21, 2015 and is based on Japanese Patent Application No. 2014-114204 filed on Jun. 2, 2014, the disclosure of which is incorporated herein by reference.

TECHNICAL FIELD

The present disclosure relates to a semiconductor device in which metal members are disposed adjacent to both of the surfaces of a semiconductor chip that is formed using a silicon carbide and the metal members are electrically connected to electrodes of the semiconductor chip through bonding members.

BACKGROUND

Conventionally, as described in Patent Literature 1, a semiconductor device has been known in which metal members are disposed adjacent to both of the surfaces of a semiconductor chip and are electrically connected to electrodes of the semiconductor chip through bonding members.

In Patent Literature 1, to the electrode on one surface of the semiconductor chip, an elastic body as the metal member is connected through the bonding member. The elastic body has, for example, a U-letter shape and is disposed so as to be elastically deformed in the thickness direction of the semiconductor chip. To the electrode on the back surface of the semiconductor chip which is opposite to the one surface, a plate-like die pad as the metal member is connected through the bonding member.

Further, a plate terminal having a plate shape is disposed on the elastic body opposite to the semiconductor chip. The plate terminal is connected to the elastic body through the bonding member.

PATENT LITERATURE

[Patent Literature 1] JP 2008-227131 A

SUMMARY

As described above, the semiconductor device described in Patent Literature 1 includes the elastic body as the metal member connected to the electrode of the semiconductor chip. Accordingly, even in the case where a semiconductor chip formed using a silicon carbide is employed, it is possible to reduce a heat stress, which is generated in an environment in which the semiconductor device is used, by means of the elastic body. That is, it is possible to improve the resistance of the semiconductor chip to the heat stress.

However, since the elastic body having the U-letter shape or the like needs to be used to reduce the stress, the heat generated by the semiconductor chip formed using the silicon carbide cannot efficiently be dissipated. In other words, a heat dissipation property is poor.

In view of the foregoing issue, it is an object of the present disclosure to provide a semiconductor device which is capable of improving the resistance of a semiconductor chip to a heat stress, while suppressing the degradation of a heat dissipation property.

According to an aspect of the present disclosure, a semiconductor device includes: a semiconductor chip formed using a silicon carbide and having electrodes on a first surface and on a second surface opposite to the first surface; a first metal member disposed adjacent to the first surface and connected to the electrode on the first surface; and a second metal member disposed adjacent to the second surface and connected to the electrode on the second surface, the first and second metal members each serving as metal members connected to the electrodes through bonding members.

In addition, a thickness direction of the semiconductor chip which is orthogonal to the first surface corresponds to a <0001> direction. Also, the semiconductor chip and at least one of the first and second members satisfy a shortest distance relationship such that a first shortest distance between respective end portions of the semiconductor chip and the at least one of the first and second metal members in a <1-100> direction orthogonal to the <0001> direction is shorter than a second shortest distance between respective end portions of the semiconductor chip and the at least one of the first and second metal members in a <11-20> direction orthogonal to the <0001> direction and the <1-100> direction.

As will be described later in detail, the present inventors have conducted intensive study on the semiconductor chip formed using the silicon carbide. As a result, it has been found that a deflecting strength in the <1-100> direction is lower than a deflecting strength in the <11-20> direction. Based on the findings, in the above-described semiconductor device, the shortest distance between the respective end portions of the semiconductor chip and the at least one of the first and second metal members is shorter in the <1-100> direction in which the deflecting strength is lower than in the <11-20> direction. This allows a bending force resulting from a heat stress to be smaller in the <1-100> direction in which the deflecting strength is lower than in the <11-20> direction. That is, the resistance of the semiconductor chip to the heat stress can be improved. In addition, since the resistance of the semiconductor chip to the heat stress is improved using the positional relationship between the semiconductor chip and the metal member, it is not necessary to use an elastic body, which has been conventionally used. Therefore, it is possible to improve the resistance of the semiconductor chip to the heat stress, while suppressing the degradation of a heat dissipation property.

BRIEF DESCRIPTION OF THE DRAWINGS

The above and other objects, features and advantages of the present disclosure will become more apparent from the following detailed description made with reference to the accompanying drawings, in which.

DETAILED DESCRIPTION

Figure 1:
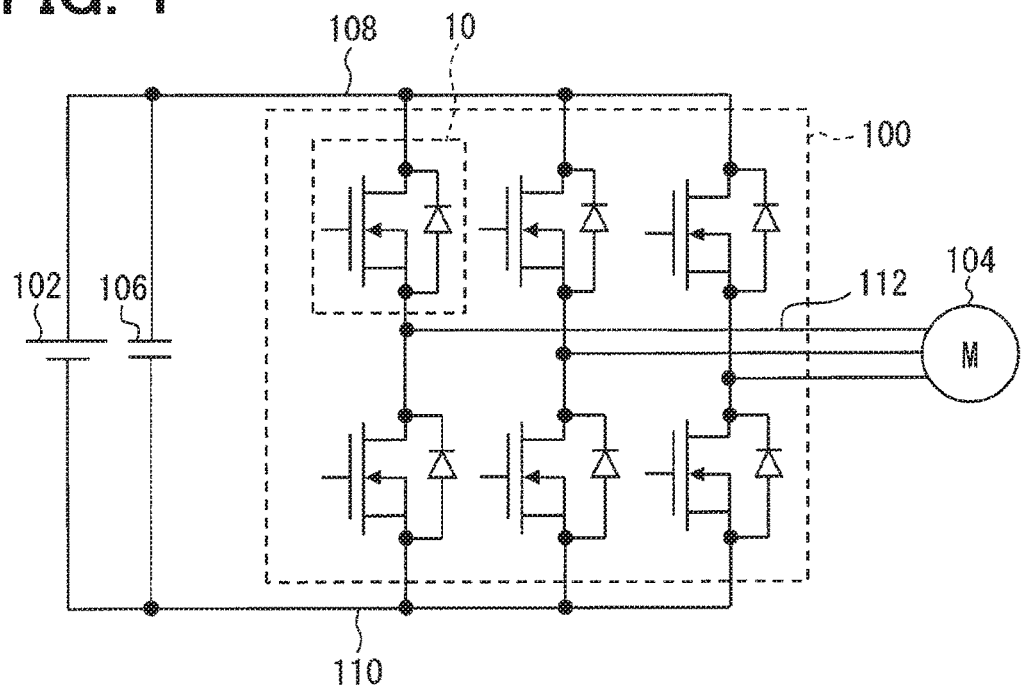
FIG. 1 is a diagram showing a schematic configuration of a power converter to which a semiconductor device according to a first embodiment is employed.

The following will describe the embodiments of the present disclosure with reference to the drawings. Note that, in each of the embodiments shown below, common or related elements are designated by the same reference numerals. Also, in the present disclosure, in a Miller index representation, '−' means a bar sign attached to the immediately subsequent index. The index with the immediately preceding sign '−' shows a negative index.

First Embodiment

First, with reference to FIG. 1, a description will be given of an example of a power converter to which a semiconductor device is employed.

A power converter 100 shown in FIG. 1 is configured so as to convert the dc voltage supplied from a dc power source 102 to a 3-phase ac current and output the 3-phase ac current to a 3-phase ac motor 104. The power converter 100 is, for example, mounted in an electric automobile or a hybrid car. In this case, the power converter 100 can also convert the power generated by the motor 104 to a dc current and charge the dc power source 102 (battery) with the dc current. Note that a reference numeral 106 shown in FIG. 1 denotes a smoothing capacitor.

The power converter 100 has a 3-phase inverter. The 3-phase inverter has upper and lower arms for three phases between a higher-potential power source line 108 connected to the positive electrode (higher-potential electrode) of the dc power source 102 and a lower-potential power source line 110 connected to a negative electrode (lower-potential electrode). The upper and lower arms of each of the phases are made of two semiconductor devices 10.

Each of the semiconductor devices 10 includes a switching element and a reflux element connected in antiparallel to the switching element. In the present embodiment, as will be described later, a MOS element as the switching element and a FWD element as the reflux element are made in the same semiconductor chip 12. However, the MOS element and the FWD element may be made in different chips. In the present embodiment, an n-channel MOSFET element is used. The cathode electrode of the FWD element is used also as the drain electrode of the FWD element and the anode electrode of the FWD element is used also as the source electrode of the FWD element.

In the semiconductor device 10 of each of the upper arms, the drain electrode of the MOS element is electrically connected to the higher-potential power source line 108 and the source electrode of the MOS element is connected to an output line 112 to the motor 104. In the semiconductor device 10 of each of the lower arms, the drain electrode of the MOS element is connected to the output line 112 to the motor 104 and the source electrode of the MOS element is electrically connected to the lower-potential power source line 110.

Note that the power converter 100 may also have, in addition to the 3-phase inverter described above, a boosting converter which raises the dc voltage supplied from the do power source 102 and a control unit which controls the operation of each of the switching elements included in the 3-phase inverter and the boosting converter.

Next, with reference to FIGS. 2 to 5, a description will be given of a configuration of the semiconductor device 10.

Figure 2:
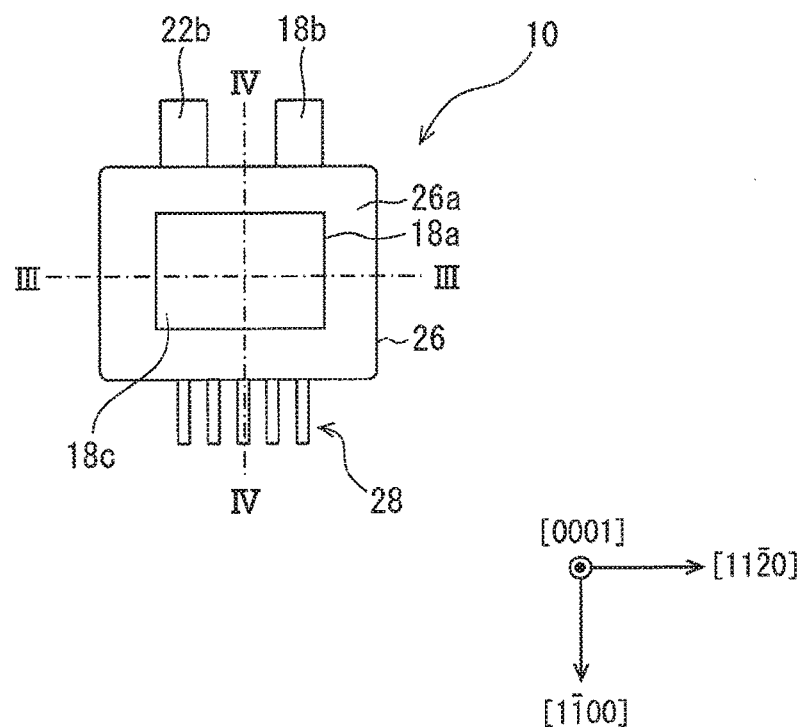
FIG. 2 is a plan view showing a schematic configuration of the semiconductor device according to the first embodiment.
Figure 3:
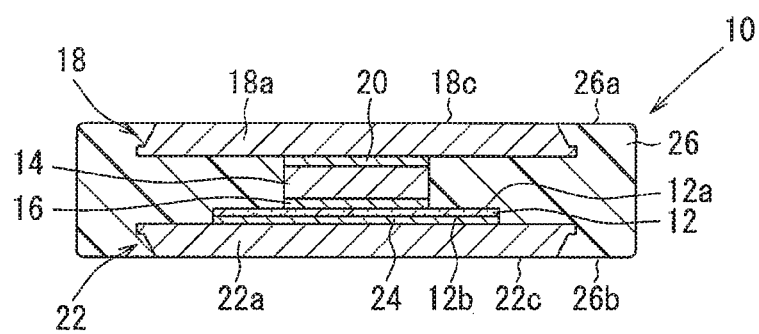
FIG. 3 is a cross-sectional view taken along the line III-III in FIG. 2.
Figure 3:
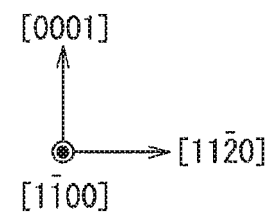
Figure 4:
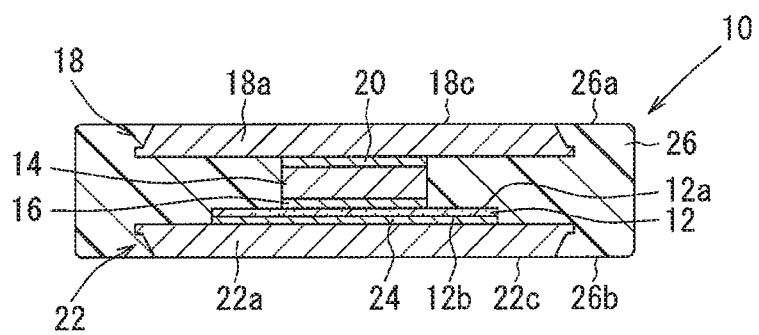
FIG. 4 is a cross-sectional view taken along the line IV-IV in FIG. 2.
Figure 4:
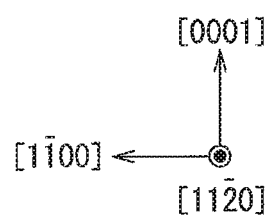

As shown in FIGS. 2 to 4, the semiconductor device 10 includes a semiconductor chip 12, a terminal 14, a heat sink 18, a heat sink 22, and an encapsulating resin body 26. Note that the terminal 14 corresponds to a first metal member and the heat sink 22 corresponds to a second metal member. On the other hand, the heat sink 18 corresponds to a third metal member. In addition, the semiconductor device 10 includes a control terminal 28.

The semiconductor chip 12 is formed using a silicon carbide. As the silicon carbide, a silicon carbide having a hexagonal crystal structure, i.e., a 4H-type or 6H-type silicon carbide can be used. In the present embodiment, the 4H-type silicon carbide having a high mobility is used. In the semiconductor chip 12, the MOS element and the FWD element forming one of the upper and lower arms are configured as vertical elements.

In the semiconductor chip 12, one surface 12a orthogonal to the thickness direction thereof is a (0001) plane. That is, the thickness direction is a [0001] direction. On the one surface 12a, a source pad and a control pad such as a gate pad are formed as external connection pads. On a back surface 12b opposite to the one surface 12a, a drain pad is formed. In the present embodiment, the back surface 12b of the semiconductor chip 12 has an average surface roughness Ra of not less than 1 nm. Note that the one surface 12a corresponds to a first surface and the back surface 12b corresponds to a second surface.

Figure 5:
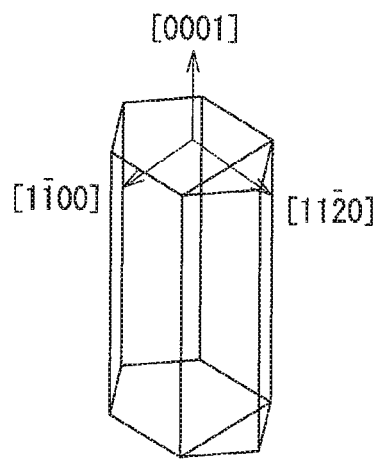
FIG. 5 is a diagram showing the relationship between crystal directions in a hexagonal crystal.

Note that, in a plane orthogonal to the [0001] direction, the semiconductor chip 12 has a generally square two-dimensional shape. Note that, as shown in FIG. 5, in a hexagonal crystal, the [0001] direction, a [1-100] direction, and a [11-20] direction satisfy the relationship of three axes being orthogonal to each other.

The terminal 14 is disposed adjacent to the one surface 12a of the semiconductor chip 12 so as to face the source pad. The terminal 14 is interposed between the semiconductor chip 12 and the heat sink 18 so as to ensure a height for connecting the control pad and the control terminal 28 by wire bonding. Thus, the terminal 14 is located on each of a heat conduction path and an electric conduction path between the heat sink 18 and the semiconductor chip 12. Accordingly, to ensure heat conductance and electric conductance, the terminal 14 is formed using at least a metal material. Specifically, the terminal 14 is made of a metal material having excellent heat conductance and electric conductance, such as copper or molybdenum.

In the present embodiment, the terminal 14 has a generally rectangular parallelepiped shape. In a plane orthogonal to the [0001] direction, the terminal 14 is disposed such that the position thereof overlaps the position of the source pad of the semiconductor chip 12. Specifically, the terminal 14 has a generally rectangular two-dimensional shape that has a longitudinal direction in the [1-100] direction. The terminal 14 is electrically connected to the source pad via the bonding member 16 made of a solder or the like.

The heat sink 18 is disposed adjacent to the surface of the terminal 14 opposite to the semiconductor chip 12. The heat sink 18 functions to dissipate the heat generated from the semiconductor chip 12 to the outside of the semiconductor device 10 and also functions as an external connection terminal. To ensure thermal conductance and electric conductance, the heat sink 18 is formed using at least a metal material. Specifically, the heat sink 18 is made of a metal material having excellent heat conductance and electric conductance, such as copper, a copper alloy, or an aluminum alloy.

The heat sink 18 has a base portion 18a disposed to face the terminal 14 and a terminal portion 18b provided to extend from the base portion 18a. In the present embodiment, the base portion 18a is provided such that the surface thereof facing the terminal 14 encompasses the terminal 14. The base portion 18a is electrically connected to the terminal 14 through a bonding member 20 made of a solder or the like.

Of the base portion 18a, the surface facing the terminal 14 serves as a heat dissipation surface 18c exposed from the encapsulating resin body 26. In the present embodiment, the heat dissipation surface 18c is substantially coplanar with the one surface 26a of the encapsulating resin body 26. The terminal portion 18b is provided to extend from one of the side surfaces of the base portion 18a which are adjacent to the heat dissipation surface 18c to the outside.

On the other hand, the heat sink 22 is disposed adjacent to the back surface 12b of the semiconductor chip 12. Similarly to the heat sink 18, the heat sink 22 also functions to dissipate the heat generated by the semiconductor chip 12 to the outside of the semiconductor device 10 and functions as an external connection terminal. The heat sink 22 has a base portion 22a disposed to face the semiconductor chip 12 and a terminal portion 22b provided to extend from the base portion 22a. In the present embodiment, the base portion 22a is provided such that the surface thereof facing the semiconductor chip 12 includes the semiconductor chip 12. The base portion 22a is electrically connected to the drain pad of the semiconductor chip 12 through a bonding member 24 made of a solder or the like.

Of the base portion 22a, the surface opposite to the semiconductor chip 12 serves as a heat dissipation surface 22c exposed from the encapsulating resin body 26. In the present embodiment, the heat dissipation surface 22c is substantially coplanar with the back surface 26b of the encapsulating resin body 26. The terminal portion 22b is provided to extend from one of the side surfaces of the base portion 22a which are adjacent to the heat dissipation surface 22c in the same direction as the extending direction of the terminal portion 18b.

The encapsulating resin body 26 integrally encapsulates the semiconductor chip 12, the terminal 14, the heat sinks 18 and 22, and the control terminal 28 while exposing the heat dissipation surfaces 18c and 22c. The encapsulating resin body 26 is, for example, made of an epoxy-based resin and molded by a transfer mold method.

Thus, the semiconductor device 10 according to the present embodiment has a double-side heat dissipation structure which allows heat to be dissipated from the both surfaces of the semiconductor chip 12.

Figure 6:
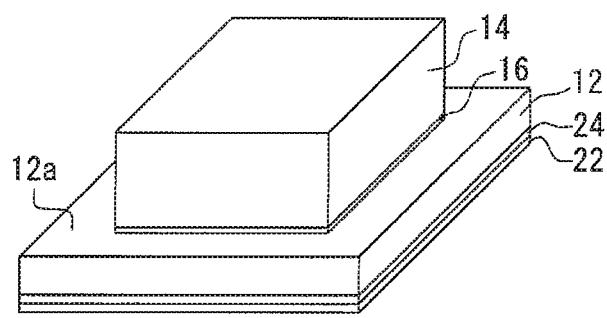
FIG. 6 is a perspective view showing the positional relationship between a semiconductor chip and a terminal.
Figure 6:
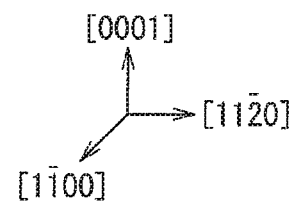

Next, with reference to FIGS. 6 and 7, a description will be given of the positional relationship between the semiconductor chip 12 and the terminal 14 in the semiconductor device 10 described above. In FIG. 6, for the sake of convenience, the heat sink 22 is shown in a simplified manner.

Figure 7:
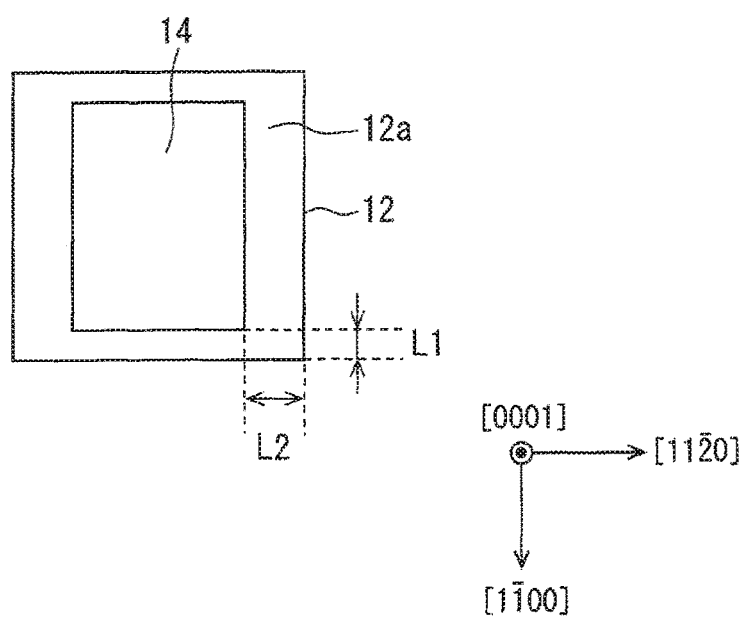
FIG. 7 is a plan view showing the positional relationship between the semiconductor chip and the terminal.

As shown in FIGS. 6 and 7, the semiconductor chip 12 has a square two-dimensional shape in the plane orthogonal to the [0001] direction. One of the two sides defining the square and orthogonal to each other is parallel with the [1-100] direction, while the other thereof is parallel with the [11-20] direction. On the other hand, the terminal 14 has a rectangular two-dimensional shape in the plane orthogonal to the [0001] direction. The long sides defining the rectangle are parallel with the [1-100] direction, while the short sides defining the rectangle are parallel with the [11-20] direction.

As described above, the terminal 14 is disposed such that the position thereof overlaps the position of the emitter pad of the semiconductor chip 12, i.e., overlaps the position of only a part of the one surface 12a. In addition, of the distances between the end portions of the semiconductor chip 12 having the square shape and the end portions of the terminal 14 having the rectangular shape, a shortest distance L1 in the [1-100] direction is shorter than a shortest distance L2 in the [11-20] direction. Note that the shortest distance L1 corresponds to a first shortest distance and the shortest distance L2 corresponds to a second shortest distance.

Next, a description will be given of effects of the semiconductor device 10 according to the present embodiment.

Figure 8:
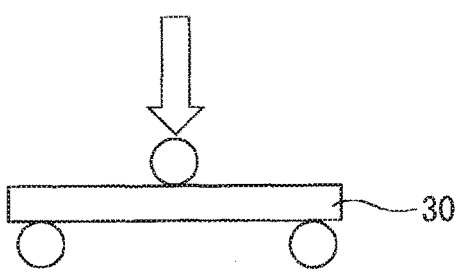
FIG. 8 is a diagram showing a test method for measuring a deflecting strength.

The present inventors conducted intensive study on a work 30 formed using the 4H-type silicon carbide. At that time, as shown in FIG. 8, the deflecting strength of the work 30 was measured using a three-point bend test.

In the three-point bend test, in a state where both of the ends of one surface of the work 30 in the [1-100] direction or the [11-20] direction are supported (fixed), a force was applied in the [0001] direction to the center of the back surface of the work 30 which was opposite to the one surface and the deflecting strength was measured. Note that the thickness of the work 30 was 400 μm, the test environment was at room temperature in the atmosphere, and the support span was 6 mm. Also, the test speed was 0.5 mm/min and fracture was set as the stopping condition. As the testing machine, an electro-hydraulic servo fatigue testing machine available from Shimadzu Corporation was used.

Also, a work 30 having a polished surface with an average surface roughness Ra of less than 1 nm as the one surface and having a ground surface with an average surface roughness Ra of not less than 1 nm as the back surface, and a work 30 having a ground surface with an average surface roughness Ra of less than 1 nm as the one surface and having a polished surface with an average surface roughness Ra of not less than 1 nm as the back surface were prepared and the three-point bend test was performed on each of the works 30. Note that the average surface roughness Ra is referred to also as an arithmetic average roughness or a center line average roughness.

Figure 9:
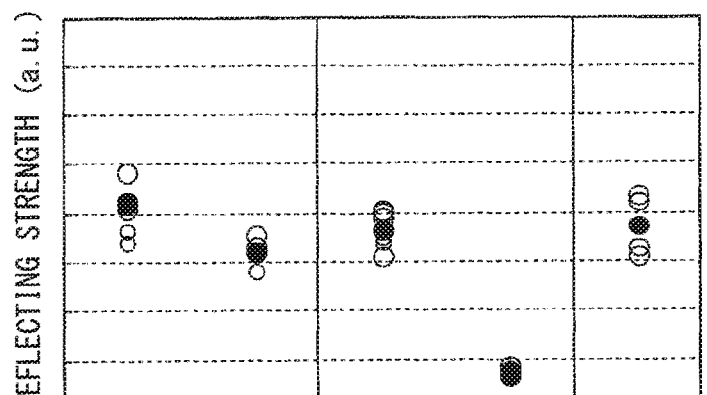
FIG. 9 is a diagram showing the relationships between the crystal directions and the deflecting strength.

As a result, as shown in FIG. 9, it was found that, in either of the cases where the polished surface was supported and where the ground surface was supported, the deflecting strength was lower in the [1-100] direction than in the [11-20] direction. It was found that, particularly in the case where the ground surface was supported, i.e., where the surface opposite to the surface to which the force was applied was rough, the deflecting strength in the [1-100] direction was significantly lower than the deflecting strength in the [11-20] direction. Note that the deflecting strength shown by the ordinate axis in FIG. 9 is in an arbitrary unit.

On the basis of the findings, in the present embodiment in which the semiconductor chip 12 and the terminal 14 are connected through the bonding member 16, of the distances between the end portions of the semiconductor chip 12 having the square shape and the end portions of the terminal 14 having the rectangular shape, the shortest distance L1 in the [1-100] direction is shorter than the shortest distance L2 in the [11-20] direction. The bending force resulting from a heat stress, i.e., a torque is proportional to a distance. Accordingly, by using the above-described configuration, the bending force resulting from the heat stress can be made smaller in the [1-100] direction in which the deflecting strength is lower than in the [11-20] direction. This can improve the resistance of the semiconductor chip 12 to the heat stress.

Since the resistance of the semiconductor chip 12 to the heat stress is improved using the positional relationship between the semiconductor chip 12 and the terminal 14, it is not necessary to use a U-shaped or S-shaped elastic body which has been conventionally used. In the present embodiment, a metal block having a rectangular parallelepiped shape is used as the terminal 14. This can improve the resistance of the semiconductor chip 12 to the heat stress, while suppressing the degradation of a heat dissipation property.

In the present embodiment, the average surface roughness Ra of the back surface 12b opposite to the one surface 12a to which the terminal 14 is bonded is not less than 1 nm. As shown in FIG. 9, when the surface opposite to the surface to which the force is applied, i.e., the supporting surface is the ground surface, the deflecting strength in the [1-100] direction is significantly lower than the deflecting strength in the [11-20] direction. However, in the present embodiment, the shortest distance L1 is set shorter than the shortest distance L2. This can reduce the bending force resulting from the heat stress in the [1-100] direction in which the deflecting strength is lower. Accordingly, even when the average surface roughness Ra of the back surface 12b is not less than 1 nm, it is possible to improve the resistance of the semiconductor chip 12 to the heat stress.

Second Embodiment

In the present embodiment, a description of portions common to the semiconductor device 10 shown in the first embodiment is omitted.

In the example shown in the first embodiment, in the plane orthogonal to the [0001] direction, the semiconductor chip 12 has a square two-dimensional shape and the terminal 14 has a rectangular two-dimensional shape. Thus, the shortest distance L1 in the [1-100] direction is shorter than the shortest distance L2 in the [11-20] direction.

Figure 10:
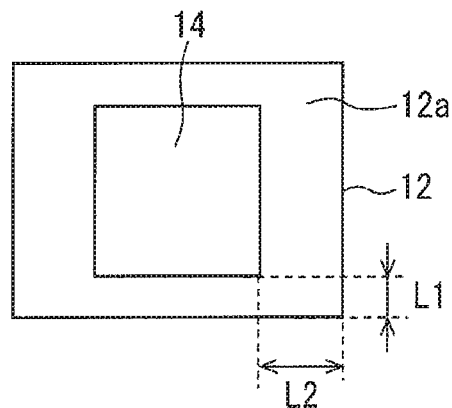
FIG. 10 is a plan view showing the positional relationship between a semiconductor chip and a terminal in a semiconductor device according to a second embodiment.
Figure 10:
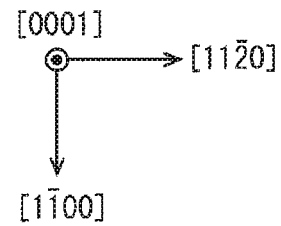

By contrast, in the present embodiment, as shown in FIG. 10, the semiconductor chip 12 has a rectangular two-dimensional shape in the plane orthogonal to the [0001] direction. Each of the long sides defining the rectangle is parallel with the [11-20] direction and each of the short sides defining the rectangle is parallel with the [1-100] direction. On the other hand, the terminal 14 has a square two-dimensional shape in the plane orthogonal to the [0001] direction. One of the two sides defining the square and orthogonal to each other is parallel with the [1-100] direction and the other thereof is parallel with the [11-20] direction.

By using the semiconductor chip 12 and the terminal 14 which have the above-described two-dimensional shapes, of the distances between the end portions of the semiconductor chip 12 and the end portions of the terminal 14, the shortest distance L1 in the [1-100] direction is shorter than the shortest distance L2 in the [11-20] direction.

By thus using the semiconductor chip 12 having the rectangular two-dimensional shape and the terminal 14 having the square two-dimensional shape, the shortest distance L1 in the [1-100] direction can be shorter than the shortest distance L2 in the [11-20] direction. Thus, the bending force resulting from the heat stress can be smaller in the [1-100] direction in which the deflecting strength is lower than in the [11-20] direction and consequently the resistance of the semiconductor chip 12 to the heat stress can be improved.

Third Embodiment

In the present embodiment, a description of portions common to the semiconductor device 10 shown in the first embodiment is omitted.

As shown in FIG. 9, in the case where the ground surface is supported, the deflecting strength in the [1-100] direction is significantly lower than the deflecting strength in the [11-20] direction. Specifically, the deflecting strength in the [11-20] direction has substantially the same value as that of the deflecting strength obtained when silicon (Si) is used as the work 30. On the other hand, the deflecting strength in the [1-100] direction is about ¼ of the value of each of these deflecting strengths.

Figure 11:
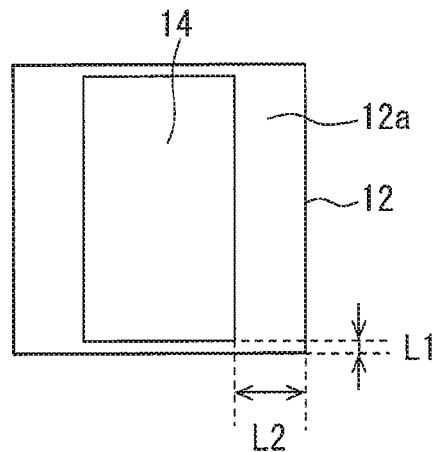
FIG. 11 is a plan view showing the positional relationship between a semiconductor chip and a terminal in a semiconductor device according to a third embodiment.
Figure 11:
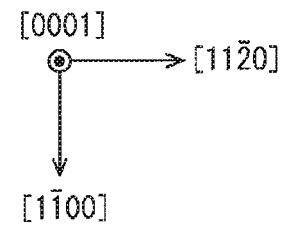

Accordingly, in the present embodiment, as shown in FIG. 11, the shortest distance L1 in the [1-100] direction has a value which is not more than ¼ of the shortest distance L2 in the [11-20] direction. As has been described above, the bending force resulting from the heat stress, i.e., the torque is proportional to the distance. Therefore, the bending force resulting from the heat stress in the [1-100] direction in which the deflecting strength is lower is made smaller to thus allow an improvement in the resistance of the semiconductor chip 12.

For example, when the shortest distance L1 is approximately ¼ of the shortest distance L2, the susceptibility to fracture of the junction portion between the semiconductor chip 12 and the terminal 14 due to the heat stress acting thereon is substantially equal in the [1-100] direction and in the [11-20] direction.

Fourth Embodiment

In the present embodiment, a description of portions common to the semiconductor device 10 shown in the first embodiment is omitted.

Each of the above-described embodiments including the first embodiment has shown the example in which the heat sinks 18 and 22 are respectively disposed adjacent to both of surfaces of the semiconductor chip 12. However, as the configuration of the semiconductor device 10, a configuration in which heat sinks are disposed adjacent to only one of the surfaces of the semiconductor chip 12 can also be used appropriately.

Figure 12:
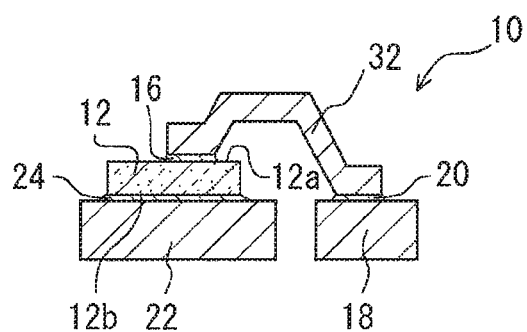
FIG. 12 is a cross-sectional view showing a schematic configuration of a semiconductor device according to a fourth embodiment.
Figure 12:
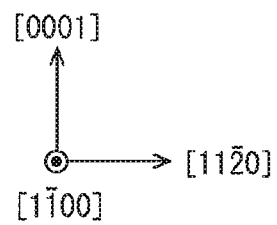

For example, in FIG. 12, each of the heat sinks 18 and 22 is disposed adjacent to the back surface 12b of the semiconductor chip 12. In FIG. 12, the surface of the heat sink 18 which is in contact with the bonding member 20 is generally coplanar with the surface of the heat sink 22 which is in contact with the bonding member 24 in the [0001] direction. A terminal 32 electrically couples the emitter pad formed on the one surface 12a of the semiconductor chip 12 to the heat sink 18. In the present embodiment, the terminal 32 corresponds to the first metal member.

Also in the semiconductor device 10 having the above described configuration, the configurations described in each of the above-described embodiments can be employed. Note that, in FIG. 12, for the sake of convenience, the encapsulating resin body 26 is omitted from the illustration.

As the configuration in which heat sinks are disposed closer to only one of the surfaces of the semiconductor chip 12, e.g., a configuration which does not have the heat sink 18 in FIG. 12 can also be used. In this case, the terminal 32 functions as the external connection terminal.

It is to be understood that the present disclosure has been described in accordance to the embodiments, but the present disclosure is not limited to the embodiment and the structure. The present disclosure also encompasses variations in the equivalent range as various modifications. In addition, embodiments and various combinations, and further, only one element thereof, less or more, and the form and other combinations including, are intended to fall within the spirit and scope of the present disclosure.

Each of the above-described embodiments has shown an example in which the thickness direction of the semiconductor chip 12 is the [0001] direction and the first shortest distance L1 in the [1-100] direction is shorter than the second shortest distance L2 in the [11-20] direction. However, the relationship between the shortest distances L1 and L2 described above may appropriately be satisfied in a <0001> direction equivalent to the [0001] direction, in a <1-100> direction equivalent to the [1-100] direction, and in a <11-20> direction equivalent to the [11-20] direction. That is, as long as the thickness direction of the semiconductor chip 12 is the <0001> direction and the first shortest distance L1 in the <1-100> direction orthogonal to the <0001> direction is set shorter than the second shortest distance L2 in the <11-20> direction orthogonal to each of the <0001> direction and the <1-100> direction, the similar effects can be achieved.

The above-described embodiments have shown the examples in which the relationship between the shortest distances L1 and L2 is satisfied in the junction portion between the semiconductor chip 12 and the terminal 14 or 32. However, it may also be possible to satisfy the relationship between the shortest distances L1 and L2 in the junction portion between the semiconductor chip 12 and the heat sink 22. Alternatively, it may also be possible to satisfy the relationship between the shortest distances L1 and L2 in the junction portion between the semiconductor chip 12 and the terminal 14 or 32 and in the junction portion between the semiconductor chip 12 and the heat sink 22.

The above-described embodiments have shown the examples in which the semiconductor device 10 has the terminal 14 or 32. However, it may also be possible to use a configuration which does not have the terminals 14 and 32. For example, when a configuration which does not have the terminal 14 is used in the first embodiment, the heat sink 18 is bonded to the emitter pad of the semiconductor chip 12. That is, the heat sink 18 corresponds to the first metal member. In this case, it may also be possible to satisfy the relationship between the shortest distances L1 and L2 in the junction portion between the semiconductor chip 12 and the heat sink 18.

The above-described embodiments have shown the examples in which the heat dissipation surfaces 18c and 22c are exposed from the encapsulating resin body 26. However, in a configuration in which the heat dissipation surfaces 18c and 22c are covered with the encapsulating resin body 26 also, the similar effects can be achieved.

The above-described embodiments have shown the examples in which the semiconductor device 10 has only one semiconductor chip 12 including the MOS element and the FWD element forming one of the upper and lower arms. That is, the above-described embodiments have shown the examples of a 1-in-1 package. However, the semiconductor device 10 can also be employed to a 2-in-1 package including two semiconductor chips 12 forming the upper and lower arms or to a 6-in-1 package including six semiconductor chips 12 forming the whole of the 3-phase inverter.

Figure 13:
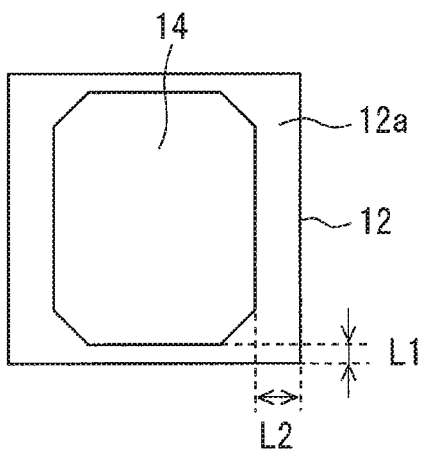
FIG. 13 is a plan view showing the positional relationship between a semiconductor chip and a terminal in a first modification.
Figure 13:
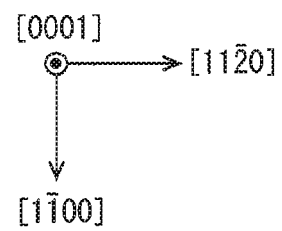
Figure 14:
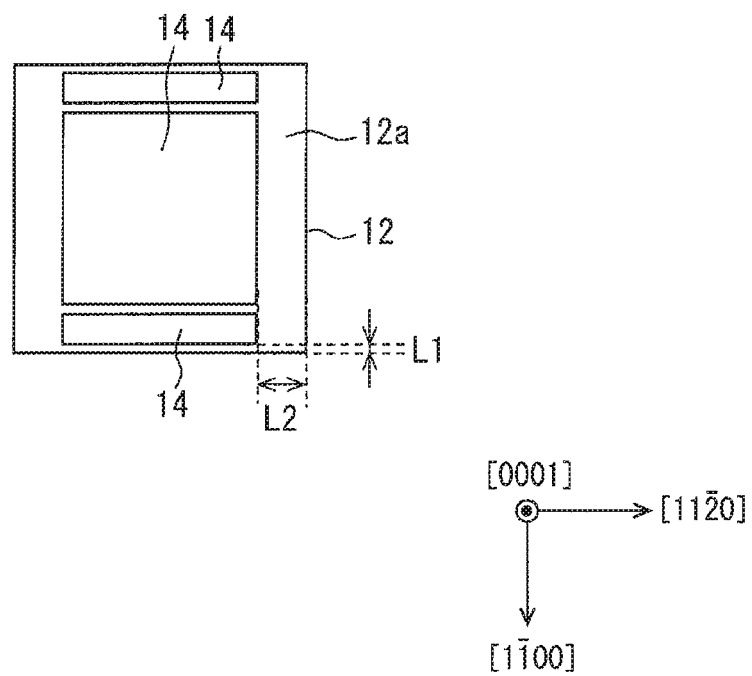
FIG. 14 is a plan view showing the positional relationship between a semiconductor chip and a terminal in a second modification.

The above-described embodiments have shown the examples in which the terminal 14 has a rectangular two-dimensional shape or a square two-dimensional shape. However, the two-dimensional shape of the terminal 14 is not limited to those in the above-described examples. The terminal 14 can also have a polygonal shape other than the rectangular shape. For example, in FIG. 13, the terminal 14 has an octagonal two-dimensional shape. As also shown in FIG. 14, the present disclosure can also be applied to the terminal 14 divided into a plurality of sections. In FIG. 14, the terminal is divided into three sections along the [1-100] direction and the shortest distance L1 is defined between each of the end terminals 14 in the [1-100] direction and the semiconductor chip 12.

What is claimed is:
1. A semiconductor device comprising:
a semiconductor chip formed using a silicon carbide and having electrodes on a first surface and a second surface opposite to the first surface;
a first metal member disposed adjacent to the first surface and connected to the electrode on the first surface through a bonding member; and
a second metal member disposed adjacent to the second surface and connected to the electrode on the second surface through a bonding member,
wherein a thickness direction of the semiconductor chip which is orthogonal to the first surface is a <0001> direction,
wherein the semiconductor chip and at least one of the first and second metal members satisfy a shortest distance relationship in which a first shortest distance between respective end portions of the semiconductor chip and the at least one of the first and second metal members in a <1-100> direction orthogonal to the <0001> direction is shorter than a second shortest distance between respective end portions of the semiconductor chip and the at least one of the first and second metal members in a <11-20> direction orthogonal to the <0001> direction and the <1-100> direction, and
wherein the first shortest distance is not more than ¼ of the second shortest distance.
2. The semiconductor device according to claim 1,
wherein an average surface roughness Ra of at least one of the first and second surfaces is not less than 1 nm, and
wherein the shortest distance relationship is satisfied by one of the first metal member and the second metal member located opposite to the at least one of the first and second surfaces having the average surface roughness Ra of not less than 1 nm and by the semiconductor chip.

3. The semiconductor device according to claim 1, wherein a two-dimensional shape of the semiconductor chip, which is orthogonal to the thickness direction, is a square, and wherein a two-dimensional shape of the at least one of the first and second metal members, which is orthogonal to the thickness direction, is a rectangle in which a dimension in the <1-100> direction is longer than a dimension in the <11-20> direction.

4. The semiconductor device according to claim 1, wherein a two-dimensional shape of the at least one of the first and second metal members, which is orthogonal to the thickness direction, is a square, and a two-dimensional shape of the semiconductor chip, which is orthogonal to the thickness direction, is a rectangle in which a dimension in the <1-100> direction is shorter than a dimension in the <11-20> direction.

5. The semiconductor device according to claim 1, further comprising:

a third metal member connected to a surface of the first metal member opposite to the semiconductor chip through a bonding member; and an encapsulating resin body integrally encapsulating the semiconductor chip, the first metal member, the second metal member, and the third metal member such that a heat dissipation surface of the third metal member opposite to the first metal member and a heat dissipation surface of the second metal member opposite to the semiconductor chip are exposed from the encapsulating resin body, wherein the first metal member satisfies the shortest distance relationship.

* * * * *